(12) United States Patent
Boja et al.

(10) Patent No.: US 10,764,996 B1
(45) Date of Patent: Sep. 1, 2020

(54) CHIP PACKAGE ASSEMBLY WITH COMPOSITE STIFFENER

(71) Applicant: Xilinx, Inc., San Jose, CA (US)

(72) Inventors: Ronilo Boja, Gilroy, CA (US); Inderjit Singh, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/012,594

(22) Filed: Jun. 19, 2018

(51) Int. Cl.
| | |
|---|---|
| *H05K 1/02* | (2006.01) |
| *H01L 25/065* | (2006.01) |
| *H01L 23/538* | (2006.01) |
| *H01L 23/00* | (2006.01) |
| *H01L 23/10* | (2006.01) |
| *H01L 23/40* | (2006.01) |

(52) U.S. Cl.
CPC .......... *H05K 1/0271* (2013.01); *H01L 23/538* (2013.01); *H01L 23/562* (2013.01); *H01L 25/0652* (2013.01); *H01L 23/10* (2013.01); *H01L 23/40* (2013.01)

(58) Field of Classification Search
CPC ....... H01L 23/562; H01L 23/10; H01L 23/40; H01L 2924/3511; H01L 23/02–10; H01L 24/02–10; H05K 1/0271
See application file for complete search history.

(56) References Cited

U.S. PATENT DOCUMENTS

| | | | | |
|---|---|---|---|---|
| 5,889,323 A * | 3/1999 | Tachibana | ............... | H01L 21/50 257/678 |
| 6,002,171 A * | 12/1999 | Desai | .................. | H01L 23/3675 257/706 |
| 6,011,304 A * | 1/2000 | Mertol | ..................... | H01L 23/04 257/704 |
| 6,703,704 B1 * | 3/2004 | Alcoe | ..................... | H01L 23/10 257/684 |
| 6,724,080 B1 * | 4/2004 | Ooi | ......................... | H01L 23/36 257/704 |
| 6,856,015 B1 * | 2/2005 | Huang | ............... | H01L 21/4882 257/704 |
| 6,861,292 B2 * | 3/2005 | Chiu | ...................... | H01L 23/04 438/121 |

(Continued)

FOREIGN PATENT DOCUMENTS

WO 2017119937 7/2017

*Primary Examiner* — David A Zarneke
(74) *Attorney, Agent, or Firm* — Patterson + Sheridan, LLP (57) ABSTRACT

A chip package assembly and method for fabricating the same are provided which utilize a composite stiffener selected to provide excellent resistance to warpage without detrimentally imposing excessive stress on a package substrate of the package assembly. In one example, the chip package assembly includes an integrated circuit die stacked on a top surface of a package substrate, and a composite stiffener coupled to a first edge of the package substrate. The composite stiffener includes a first stiffener member and a second stiffener member. The first stiffener member has a bottom surface bonded to the top surface of the package substrate. The second stiffener member is disposed over the first stiffener member. The second stiffener member has a bottom surface bonded to the top surface of the package substrate. The second stiffener member has a Young's modulus that is less than a Young's modulus of the first stiffener member.

20 Claims, 5 Drawing Sheets

(56) References Cited

U.S. PATENT DOCUMENTS

| | | | |
|---|---|---|---|
| 6,861,750 B2 * | 3/2005 | Zhao | H01L 23/3677 257/666 |
| 6,903,278 B2 | 6/2005 | Sathe | |
| 6,936,919 B2 * | 8/2005 | Chuang | H01L 23/367 257/706 |
| 6,982,470 B2 * | 1/2006 | Omori | H01L 23/04 257/432 |
| 7,026,711 B2 * | 4/2006 | Lee | H01L 23/36 257/704 |
| 7,102,228 B2 * | 9/2006 | Kanda | H01L 23/16 257/729 |
| 7,245,500 B2 * | 7/2007 | Khan | H01L 23/13 174/255 |
| 7,327,015 B2 * | 2/2008 | Yang | H01L 23/045 257/660 |
| 7,459,782 B1 | 12/2008 | Li | |
| 7,482,686 B2 * | 1/2009 | Zhao | H01L 23/24 257/687 |
| 7,538,421 B2 * | 5/2009 | Chen | H01L 23/16 257/704 |
| 8,076,177 B2 * | 12/2011 | Chen | H01L 24/81 257/741 |
| 8,216,887 B2 | 7/2012 | Heng et al. | |
| 8,927,344 B2 * | 1/2015 | Topacio | H01L 23/16 257/E21.505 |
| 9,275,876 B2 * | 3/2016 | Kim | H01L 21/4817 |
| 9,418,909 B1 * | 8/2016 | Chaware | H01L 24/32 |
| 9,853,011 B2 * | 12/2017 | Lu | H01L 23/24 |
| 10,049,896 B2 * | 8/2018 | Iruvanti | H01L 21/4853 |
| 2003/0001251 A1 * | 1/2003 | Cheever | B81B 7/0006 257/685 |
| 2004/0183184 A1 | 9/2004 | Libous et al. | |
| 2006/0034060 A1 * | 2/2006 | Schultz | H01L 23/04 361/719 |
| 2006/0249852 A1 * | 11/2006 | Chiu | H01L 23/36 257/778 |
| 2007/0047210 A1 * | 3/2007 | Diaz | H01L 23/40 361/719 |
| 2008/0123311 A1 | 5/2008 | Goldmann et al. | |
| 2009/0200059 A1 * | 8/2009 | Cinquemani | H01B 9/025 174/113 R |
| 2013/0069216 A1 * | 3/2013 | Miyake | H01L 23/02 257/687 |
| 2014/0138811 A1 * | 5/2014 | Pandey | H01L 23/147 257/690 |
| 2014/0374896 A1 * | 12/2014 | Nishida | H01L 21/4882 257/712 |
| 2017/0170086 A1 * | 6/2017 | Iruvanti | H01L 23/10 |

\* cited by examiner

CHIP PACKAGE ASSEMBLY WITH COMPOSITE STIFFENER

TECHNICAL FIELD

Embodiments of the present invention generally relate to a chip package assembly, and in particular, to chip package assembly having an integrated circuit (IC) die and composite stiffener disposed on an interconnect substrate, the stiffener stiffening the chip package assembly out of plane deformation.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a plurality of integrated circuit (IC) dice to be mounted to a single package substrate. The IC dice may include memory, logic or other IC devices.

Out of plane deformation of the chip package assembly can be problematic to conventional chip packaging schemes. In many instances, a stiffener is utilized to stiffening the chip package assembly against out of plane deformation. However, particularly in larger chip package assemblies, the stiffener itself may bend or twist, or even become delaminated from chip package assembly, thus still permitting undesirable warpage and bending during manufacture and/or use. Such warpage and bending of the chip package assembly can lead to solder connection failure or other damage to the components and devices of the chip package assembly, which may detrimentally effect device performance and reliability.

In large chip package assemblies, simply utilizing a heavy duty (e.g., "stiffer") stiffener has not shown to be a robust solution. Particularly, heavy duty stiffeners that rigidly hold the chip package assembly extremely flat without any flexibility induce large stresses on the interconnect substrate to which the dice are mounted. Such large stresses can lead to solder connection failure or other damage to the components and devices of the chip package assembly, even if the substrate itself doesn't warp or bend. Solder connection failure is particularly problematic when lead-free solder is utilized to make the electrical connections between the interconnect substrate and dice, as lead-free solder is not a strong as the more commonly used tin-lead (Sn—Pb) solders, which have greater tensile and shear strengths.

Therefore, a need exists for an improved chip package assembly, and in particular, to a chip package assembly having an improved stiffener.

SUMMARY

A chip package assemblies and methods for fabricating the same are provided which utilize a composite stiffener selected to provide excellent resistance to warpage without detrimentally imposing excessive stress on a package substrate of the chip package assembly. In one example, the chip package assembly includes an integrated circuit die stacked on a top surface of a package substrate, and a composite stiffener coupled to a first edge of the package substrate. The composite stiffener includes a first stiffener member and a second stiffener member. The first stiffener member is bonded to the package substrate. The second stiffener member is disposed over the first stiffener member. The second stiffener member has a bottom surface bonded to the top surface of the package substrate. The second stiffener member has a Young's modulus that is less than a Young's modulus of the first stiffener member.

In another example, a chip package assembly is provided that includes a package substrate, an integrated circuit die stacked on a top surface of the package substrate and a composite stiffener coupled to a first edge of the package substrate. The composite stiffener includes a first stiffener member having a bottom surface bonded to the top surface of the package substrate. The composite stiffener also includes a second stiffener member having a first wall connected to a second wall, the first wall and the second wall straddling the first stiffener member and bonded to the top surface of the package substrate. The second stiffener member has a Young's modulus less than a Young's modulus of the first stiffener member.

In yet another example, a method for fabricating a chip package assembly is provided. The method includes stacking an integrated circuit die on a top surface of a package substrate, bonding a bottom surface of a first stiffener member to the top surface of the package substrate, and bonding a bottom surface of a second stiffener member to the top surface of the package substrate, the second stiffener member disposed over the first stiffener member, the second stiffener member having a Young's modulus less than a Young's modulus of the first stiffener member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided which utilize an improved stiffener. The chip package assembly described herein includes at least one integrated circuit (IC) die and a composite stiffener disposed on an interconnect substrate. The interconnect substrate may be an interposer or I/O die mounted on a package substrate, or alternatively, the interconnect substrate may be a package substrate on which the IC die is directly mounted without an intervening interposer. The composite stiffener is comprised to at least a first stiffener member and a second stiffener member, each of which is fabricated from a different material. The different materials of the stiffener members may be selected to achieve an overall stiffness and and stress inducing properties of the composite stiffener that is tailored (i.e., selected) to provide an appropriate resistance to warpage without inducing excessive stress on the interconnect substrate that may diminish the reliability of electrical connections. The resulting chip package assembly with composite stiffener thus provides increased the resistance to out of plane deformation during the fabrication and use of the chip package assembly, which enhances the reliability of the die to interconnect substrate electrical connections. Advantageously, the enhanced stiffness of the chip package assembly improves reliability and performance. Moreover, as the flatness and stress is tailored by way of the materials and geometry selection of composite stiffener, use of lead-free solder interconnections between the interconnect substrate and die may be utilized with substantial improvement in the reliability of the solder interconnection, thus, resulting in a more robust and reliable chip package assembly.

Figure 1:
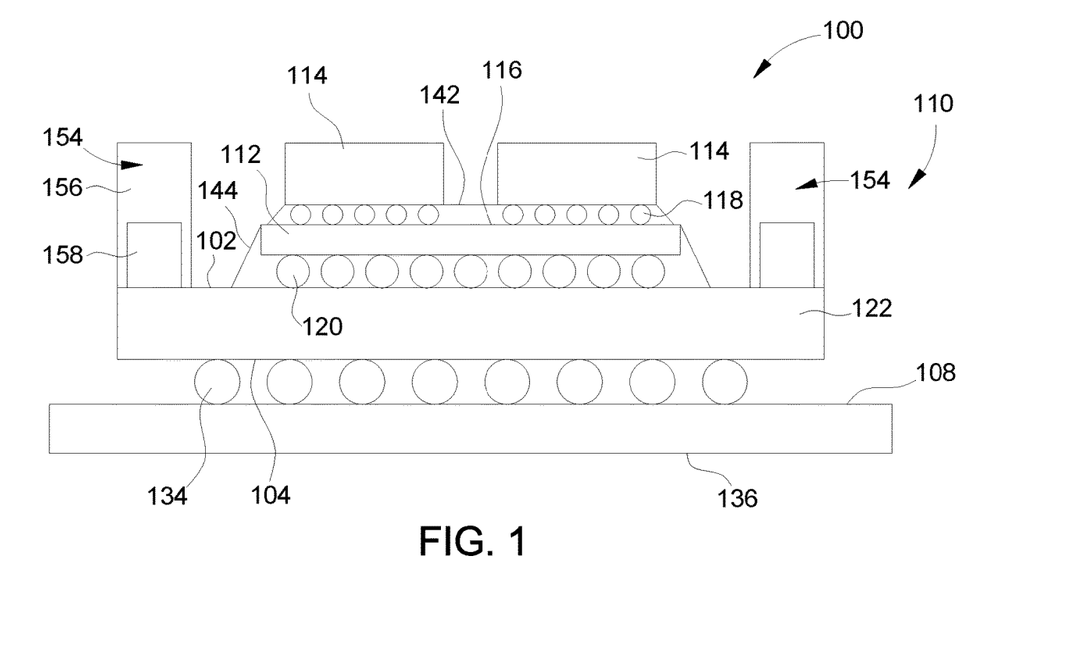
FIG. 1 is a front schematic view of an electronic device having an integrated chip package assembly, the integrated chip package assembly having one example of a composite stiffener.

Turning now to FIG. 1, an exemplary integrated chip package assembly 110 is schematically illustrated disposed on a printed circuit board (PCB) 136. The chip package assembly 110 and the PCB 136 together form at least part of an electronic device 100. The electronic device 100 may be a tablet, computer, copier, digital camera, smart phone, control system, automated teller machine, server or other solid-state memory and/or logic device.

The chip package assembly 110 includes at least one IC die 114 mounted to an interconnect substrate. As discussed above, the interconnect substrate may be in the form of an interposer, a package substrate, an I/O die, or other suitable structure. In FIG. 1, two IC dice 114 are mounted on the interconnect substrate, the interconnect substrate being in the form of an interposer 112 that is stacked on a package substrate 122. The interposer 112 may also be in the form of an input/output (I/O) die. Alternatively, the IC die 114 may be stacked directly on an interconnect substrate in the form of the package substrate 122, without the presence of an interposer 112, as shown in FIG. 2.

Figure 2:
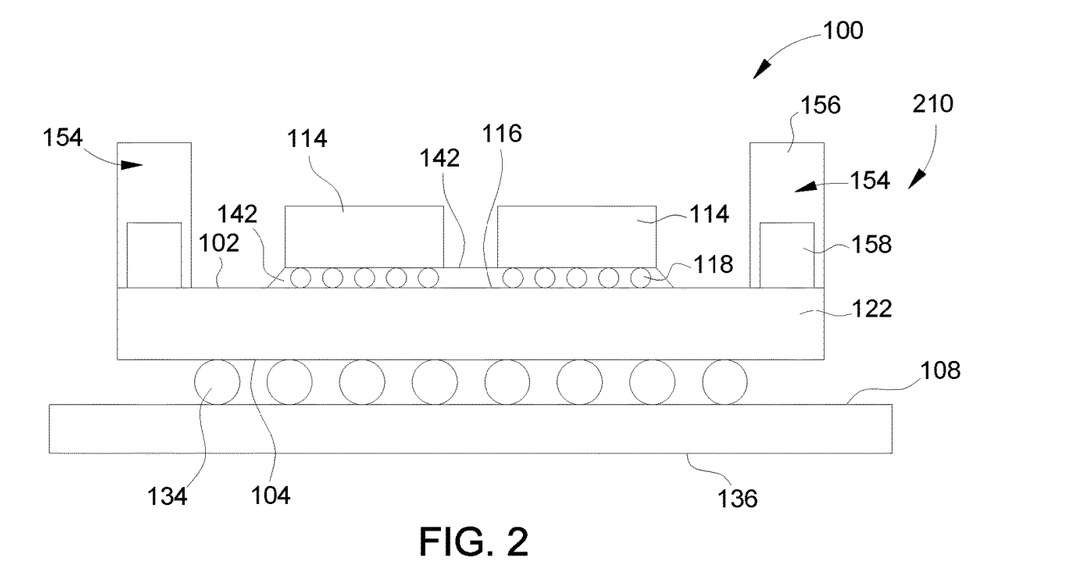
FIG. 2 is a front schematic view of another of an electronic device having an integrated chip package assembly that may utilize the composite stiffener depicted in FIG. 1, among others.

Although two IC dice 114 are shown in the examples depicted in FIG. 1 and FIG. 2, the number of IC dice 114 may range from one to as many as can be fit within the chip package assembly 110. A composite stiffener 154 is coupled to the package substrate 122 in a manner that enhances the resistance of the package substrate 122, and consequently the chip package assembly 110, against out of plane deformation without excessive stress generation, as further discussed below.

Returning back to FIG. 1, the interposer 112 includes circuitry for electrically connecting the dice 114 to circuitry of the package substrate 122. The circuitry of the interposer 112 may optionally include transistors and/or other circuit elements. Solder connections 120, also known as or "package bumps" or "C4 bumps," are utilized to provide an electrical connection between the circuitry of the interposer 112 and the circuitry of the package substrate 122. The solder connections 120, when in the form of solder joints, may be fabricated from tin-lead solder, lead-free solder or other suitable solder. Optionally, the solder connections 120 may be a hybrid bond that utilizes metals bonding to metals and dielectric bonding to dielectric. A bottom surface 104 of the package substrate 122 may be mounted and connected to a top surface 108 of the PCB 136, utilizing solder balls 134, wire bonding or other suitable technique. An undermolding 144 may be utilized to fill the space not taken by the solder connections 120 between the PCB 136 and the interposer 112.

The IC dice 114 are mounted to one or more surfaces of the interposer 112, or alternatively in implementations wherein an interposer is not utilized, to the package substrate 122. The IC dice 114 may be programmable logic devices, such as field programmable gate arrays (FPGA), memory devices, optical devices, processors or other IC logic structures. Optical devices include photo-detectors, lasers, optical sources, and the like. In the example depicted in FIG. 1, the IC dice 114 are mounted to a top surface 116 of the interposer 112 by die connections 118. The die connections 118 may be in the form of a plurality of solder joints, also known as "micro-bumps". The die connections 118, when in the form of solder joints, may be fabricated from tin-lead solder, lead-free solder or other suitable solder. Optionally, the die connections 118 may be a hybrid bond that utilizes metals bonding to metals and dielectric bonding to dielectric. The die connections 118 mechanically and electrically connect the circuitry of each IC die 114, and thus the wafer segment 106, to circuitry of the interposer 112. The circuitry of the interposer 112 connects the die connections 118 to selective solder connections 120, and hence, connects selective circuitry of each IC die 114 to the package substrate 122, to enable communication of the dice 114 with the PCB 136 after the chip package assembly 110 is mounted within the electronic device 100. An undermolding 142 may be utilized to fill the space not taken by the die connections 118 between the dice 114 and interposer 112. When the optional interposer 112 is not present, the die connections 118 connects selective circuitry of each IC die 114 to the package substrate 122 to enable communication of the dice 114 with the PCB 136, such as shown in the chip package assembly 210 of FIG. 2.

Continuing to refer to FIG. 1 and as discussed above, the composite stiffener 154 is coupled to the top surface 102 of the package substrate 122 in a manner that enhances the resistance of the package substrate 122 to out of plane deformation. The composite stiffener 154 is generally positioned at the edge of the package substrate 122 outward of the dice 114.

The composite stiffener 154 includes at least two stiffener members, shown in FIG. 1 as a first stiffener member 156 and a second stiffener member 158. The first stiffener member 156 is fabricated from a material that is different than a material utilized to fabricate the second stiffener member 158. By utilizing different materials, the Young's modulus, also known as the elastic modulus, of the first stiffener member 156 is different than the Young's modulus of the second stiffener member 158. The difference in Young's modulus which allows the overall stiffness of the composite stiffener 154 to be selected across a greater range such that the stiffness of the composite stiffener 154 may be tuned for a specific configuration of the chip package assembly 110. The stiffness of the composite stiffener 154 is additionally affected by the relative sectional geometries of the stiffener members 156, 158, thus allowing the target stiffness of the composite stiffener 154 to be more precisely selected from over an even wider range of stiffness, particularly bas compared to a conventional, single element stiffener, while still controlling stress to acceptable levels to yield a robust and reliable chip package assembly 110.

In practice, the target flatness and stress of the interconnect substrate and chip package assembly 110 may be determined empirically, through modeling, design of experiments, or other suitable technique. Once the target flatness and stress is determined, the materials and relative geometry of the stiffener members 156, 158 are selected such that the target flatness and stress of the interconnect substrate and chip package assembly 110 are realized. Thus, the materials and relative geometry of the stiffener members 156, 158 selected to form the composite stiffener 154 allow flatness criteria of the chip package assembly 110 to be achieved without overstressing the electrical connections with the dice 114, advantageously yielding a much more robust and reliable chip package assembly 110.

Examples of materials suitable for fabricating the stiffener members 156, 158 include metals, ceramics, thermoplastics, glass reinforced plastics, and carbon reinforced materials, among others. In one example, the stiffener members 156, 158 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials.

Figure 3:
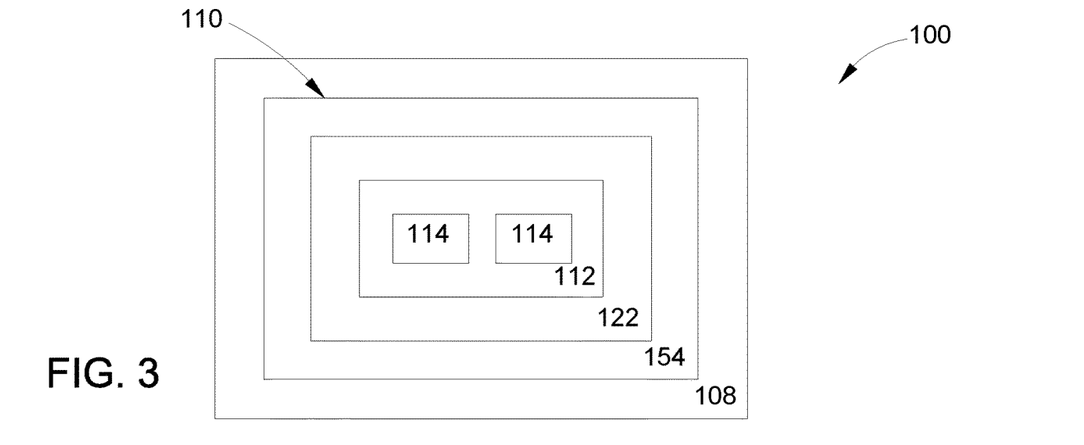
FIG. 3 is a top view of the electronic device of FIG. 1 illustrating one configuration of a composite stiffener.
Figure 4:
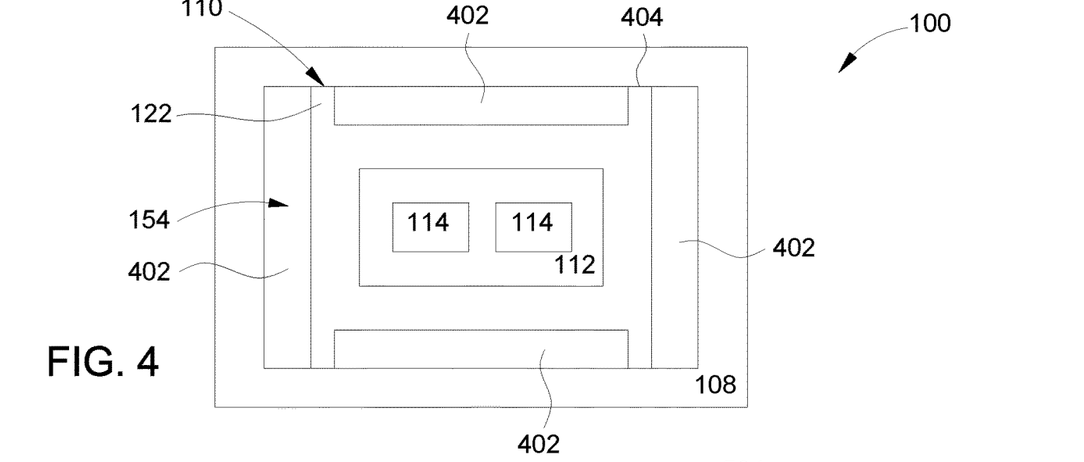
FIG. 4 is a top view of the electronic device of FIG. 1 illustrating another configuration of a composite stiffener.
Figure 5:
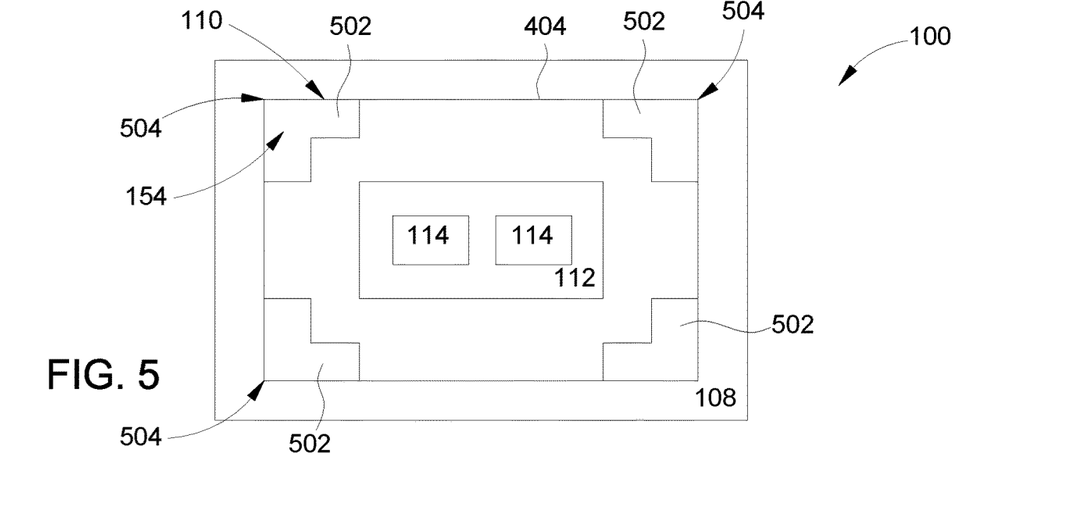
FIG. 5 is a top view of the electronic device of FIG. 1 illustrating another configuration of a composite stiffener.

The composite stiffener 154 is generally positioned at the perimeter edge of the package substrate 122. The composite stiffener 154 is located outward of the dice 114 relative to a center of the chip package assembly 110. The composite stiffener 154 may have a ring shape, be fabricated in one or more attached sections, or be fabricated in one more more attached spaced apart sections. A few examples depicting the shape of the composite stiffener 154 are illustrated in FIGS. 3-5, although others shapes and configurations are contemplated. Although the chip package assembly 110 of FIG. 1 is illustrated in FIGS. 3-5, the configurations depicted and described for the composite stiffener 154 are illustrated in FIGS. 3-5 may also be utilized with the the chip package assembly 110 of FIG. 2, or other suitable chip package assembly.

In one example depicted in a top view of the electronic device 100 illustrated in FIG. 3, the composite stiffener 154 has a ring-shape. The ring-shape composite stiffener 154 is disposed adjacent the perimeter of the the package substrate 122 and circumscribes the dice 114. The ring-shape composite stiffener 154 may be a single continuous ring, be made from a plurality of touching segments, or made from a plurality of spaced-apart segments, where each segment includes both stiffener members 156, 158.

FIG. 4 is a top view of the electronic device 100 illustrating another example of a composite stiffener 154 that has a ring-shape. The composite stiffener 154 includes a plurality of spaced-apart segments 402. The segments 402 are generally positioned adjacent the perimeter (i.e., edges 404) of the package substrate 122. Although one segment 402 is shown disposed along each edge 404 of the package substrate 122, the segments 402 may be arranged in other configurations. For example, two or more segments 402 may be disposed along one or more edges 404 of the package substrate 122. In another example, one or more segments 402 may be disposed one at least one edge 404 of the package substrate 122, such that at least one one edge 404 of the package substrate 122 has no segments 402 of the composite stiffener 154.

FIG. 5 is a top view of the electronic device 100 illustrating yet another example of a composite stiffener 154 comprised of a plurality of spaced-apart segments 502. The segments 502 are generally positioned adjacent corners 504 of the package substrate 122, such that a portion of each segment 502 is disposed along adjacent edges 404 of the package substrate 122. Although one corner 504 is shown disposed at the intersection of each pair of edges 404 of the package substrate 122, the corners 504 may be arranged in other configurations. For example, only a single corner 504 may be utilized on the package substrate 122. In another example, 2 or 3 corners 504 may be utilized on the package substrate 122. It is also contemplated that one or more corners 504 may be utilized with one or more segments 402.

Figure 6:
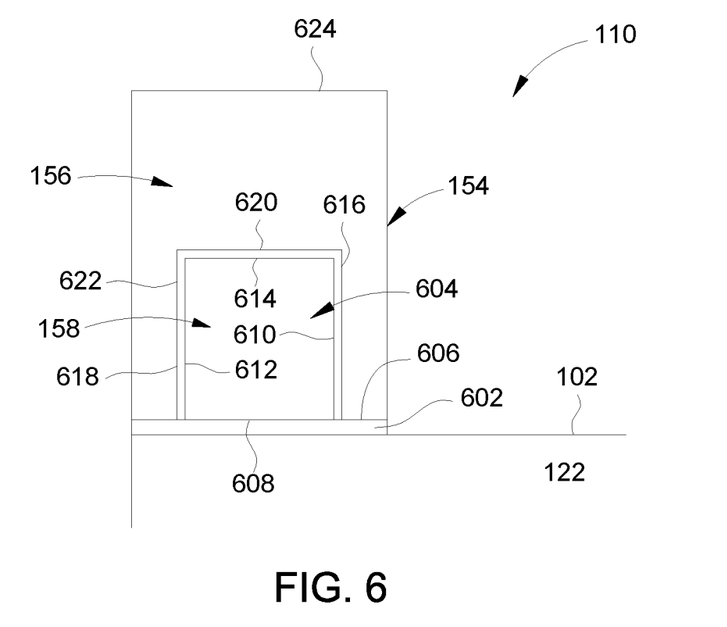
FIG. 6 is a partial sectional view of the integrated chip package assembly depicted in FIG. 1 illustrating the sectional profile of the composite stiffener in greater detail.

FIG. 6 is a partial sectional view of a portion of the chip package assembly 110 illustrating the sectional profile of the stiffener members 156, 158 of the composite stiffener 154 in greater detail. Each stiffener member 156, 158 include a respective bottom surface 606, 608 that is attached to the top surface 102 of the package substrate 122 by an adhesive layer 602. Adhesives suitable for use as the adhesive layer 602 include epoxies, among others. As the bottom surfaces 606, 608 are secured directly to the the top surface 102 of the package substrate 122, the bending resistance of each stiffener member 156, 158 is more effectively imparted on the package substrate 122, as opposed to having only a single one of the bottom surfaces 606, 608 of the stiffener members 156, 158 of the composite stiffener 154 attached directly to the top surface 102 of the package substrate 122.

The first stiffener member 156 includes a recess 604 formed in the bottom surface 606. The recess 604 includes interior sidewalls 616, 618 and an interior top surface 620. The second stiffener member 158 is configured to reside at least partially, or completely within the recess 604 of the first stiffener member 156. In the example depicted in FIG. 6, the second stiffener member 158 is disposed completely within the recess 604 such that the bottom surfaces 606, 608 of the stiffener members 156, 158 of the composite stiffener 154 are coplanar. Thus, the second stiffener member 158 is captured by the first stiffener member 156 against the top surface 102 of the package substrate 122.

In one example, the second stiffener member 158 has a Young's modulus that is greater than the Young's modulus of the first stiffener member 156. This advantageously allows the stiffer second stiffener member 158 to be smaller and to have a simpler profile as compared to the first stiffener member 156. For example, the second stiffener member 158 may have a polygonal (i.e., quadrilateral, for example a square or rectangular) sectional profile while the first stiffener member 156 has an inverted "C" shape. The second stiffener member 158 may alternatively have a triangular, pentagonal, hexagonal, or other sectional profile. The second stiffener member 158 is shown with a solid cross section, but may alternatively be hollow. It is also contemplated that the second stiffener member 158 may alternatively have other shapes, such as a C-shape, an H-shape, an X-shape, a V-shape, a W-shape, an E-shape, a Y-shape, an S-shape, a K-shape, an N-shape and an M-shape, among others. Since the stiffer second stiffener member 158 is relatively smaller and has a simpler profile as compared to the more flexible first stiffener member 156, the overall cost to manufacture the composite stiffener 154 may be effectively controlled as the materials with higher Young's modulus are generally more expensive and harder (i.e., more costly) to fabricate.

The second stiffener member 158, as discussed above, has a quadrilateral sectional profile defined by exterior sidewalls 610, 612, a top surface 614 and the bottom surface 608 that is complementary to (i.e., fits within and closely follows) the sectional profile of the recess 604. The exterior sidewalls 610, 612 of the second stiffener member 158 are bonded to the interior sidewalls 616, 618 of the first stiffener member 156 by an adhesive layer 622. The adhesive utilized for the adhesive layer 622 may be the same as the adhesive utilized for the adhesive layer 602. Since the bonded sidewalls 610, 612, 616, 618 extend in a direction that is non-planar to the top surface 102 of the package substrate 122, the bending resistance of the composite stiffener 154 is enhanced. For example, the sidewalls 610, 612, 616, 618 may be disposed at an angle between about 45 degrees and 90 degrees relative to the top surface 102 of the package substrate 122. In the example depicted in FIG. 6, the bonded sidewalls 610, 612, 616, 618 extend in a direction that is perpendicular to the top surface 102 of the package substrate 122. The interior top surface 620 of the first stiffener member 156 may optionally be adhered to the exterior top surface 614 of the second stiffener member 158.

It is also contemplated that the composite stiffener 154 may be rotated 180 degrees such that an exterior top surface 624 of the first stiffener member 156 is secured to the top surface 102 of the package substrate 122 by the adhesive layer 602. In such an implementation where the second stiffener member 158 is not directly coupled to the top surface 102 of the package substrate 122, the composite stiffener 154 will impart less stiffness to the chip package assembly 110. However depending on the application, the more flexible configuration for the composite stiffener 154 may be still stiffness enough to meet the design flatness targets for certain configurations for the chip package assembly 110. The composite stiffener 154 may be rotated 90 or 270 degrees from the orientation illustrated in FIG. 6.

Figure 7:
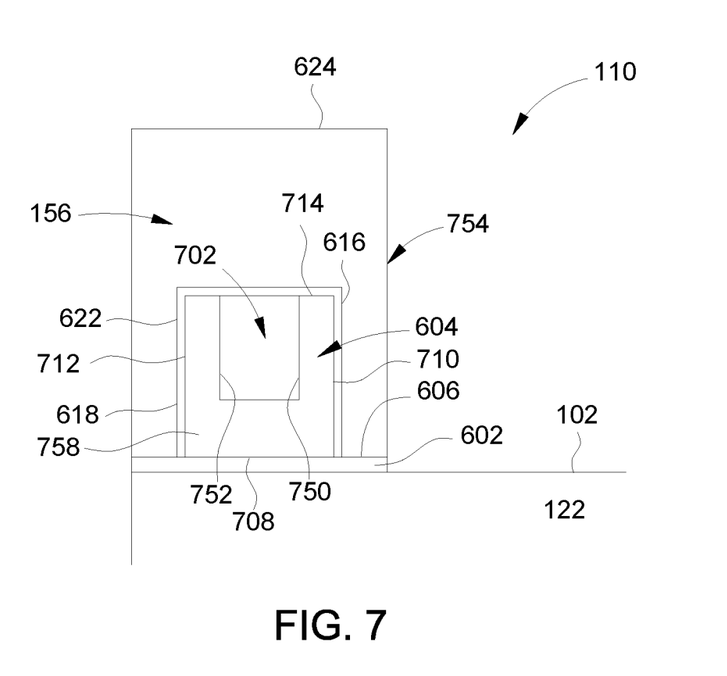
FIGS. 7-8 are partial sectional views of the integrated chip package assembly depicted in FIG. 1 illustrating different sectional profiles of the composite stiffener in greater detail.

FIG. 7 is another partial sectional view of a chip package assembly 110 having another example of a composite stiffener 754. The chip package assembly 110 may be fabricated as discussed above, except wherein the composite stiffener 754 has a second stiffener member 758 that does not have a solid regular polygonal sectional profile.

The composite stiffener 754 generally includes at least a first stiffener member 156 and a second stiffener member 758. The stiffener members 156, 758 are fabricated from different materials and have different geometries as discussed above to tailor the overall stiffness and stress inducing properties of the composite stiffener 754. In the example depicted in FIG. 7, each of the stiffener members 156, 758 are bonded to the top surface 102 of the package substrate 122 which impart greater bending resistance to the package substrate 122.

The second stiffener member 758 includes exterior sidewalls 710, 712, a top surface 714 and the bottom surface 708. The exterior sidewalls 710, 712 of the second stiffener member 758 are bonded to the interior sidewalls 616, 618 of the first stiffener member 156 by an adhesive layer 622. The bonded sidewalls 610, 612, 616, 618 enhance the bending resistance of the composite stiffener 754.

A recess 702 is formed in the top surface 714 of the second stiffener member 758. The recess 702 may be defined by an air gap, be filled with another non-rigid material, or be filled with a third stiffener member (no shown). When a third stiffener member is disposed in the recess 702, the material of the third stiffener member may be the same or different than the material of one of the first and second stiffener members 156, 758, and utilized to further tune the composite stiffener 756. In one example, the material of the third stiffener member has a Young's modulus that is greater than that of the material utilized for the first stiffener member 156.

It is contemplated that the second stiffener member 758 may be rotated, such as 180 degrees, within the recess 604 of the first stiffener member 156 such that the top surface 714 of the second stiffener member 758 is adhered to the top surface 102 of the package substrate 122. The second stiffener member 758 may be rotated 90 or 270 degrees from the orientation illustrated in FIG. 7. It is also contemplated that the composite stiffener 754 may be rotated 180 degrees such that an exterior top surface 624 of the first stiffener member 156 is secured to the top surface 102 of the package substrate 122 by the adhesive layer 602. In such an implementation where the second stiffener member 758 is not directly coupled to the top surface 102 of the package substrate 122, the orientation of the second stiffener member 758 within the recess 604 of the first stiffener member 156 may be rotated as desired to obtain a desired bending resistance of the composite stiffener 754. The composite stiffener 754 may be rotated 90 or 270 degrees from the orientation illustrated in FIG. 7.

Figure 8:
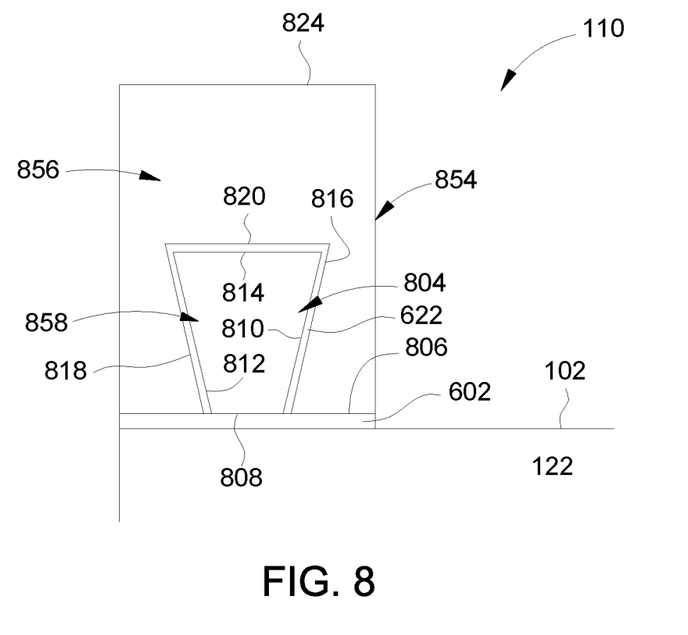

FIG. 8 is a partial sectional view of a portion of a chip package assembly 110 illustrating another example of a composite stiffener 854. The composite stiffener 854 includes at least two interlocking members 856, 858. Each stiffener member 856, 858 include a respective bottom surface 806, 808 that is attached to the top surface 102 of the package substrate 122 by an adhesive layer 602. As the bottom surfaces 806, 808 are secured directly to the the top surface 102 of the package substrate 122, the bending resistance of each stiffener member 856, 858 is more effectively imposed on the package substrate 122.

The first stiffener member 856 includes a recess 804 formed in the bottom surface 806. The recess 804 includes interior sidewalls 816, 818 and an interior top surface 820. The second stiffener member 858 is configured to reside at least partially, or completely within the recess 804 of the first stiffener member 856. In the example depicted in FIG. 8, the second stiffener member 858 is disposed completely within the recess 804.

In one example, the second stiffener member 858 has a Young's modulus that is greater than the Young's modulus of the first stiffener member 856. This advantageously allows the stiffer second stiffener member 858 to be smaller and to have a simpler profile as compared to the first stiffener member 856. The difference in Young's modulus also provides greater flexibility and a wider range of stiffness for tuning the flexibility, flatness and stress of the package substrate 122, and ultimately the chip package assembly 110.

The second stiffener member 858 has a sectional profile that interlocks with the recess 804 formed in the first stiffener member 856. For example, the sectional profile of the second stiffener member 858 may be shape that engages the recess 804 in a complimentary male-female interlocking configuration. In the example depicted in FIG. 8, the second stiffener member 858 includes exterior sidewalls 810, 812, a top surface 814 and the bottom surface 808 that forms an interlocking trapezoid with the recess 804. Other interlocking configurations may also be utilized, such as T-shapes and interlocking circles, among others. The interlocking stiffener members 856, 858 further increase the rigidity of the composite stiffener 854, thus allowing a wider range of stiffness to be selected when designing the stiffener 854. It is also contemplated that the second stiffener member 858 may alternatively have other profiled such as described above with reference to the second stiffener member 758.

The exterior sidewalls 810, 812 of the second stiffener member 858 are bonded to the interior sidewalls 816, 818 of the first stiffener member 856 by an adhesive layer 622. Since the bonded sidewalls 810, 812, 816, 818 extend in a direction that is non-planar to the top surface 102 of the package substrate 122, the bending resistance of the composite stiffener 854 is enhances. In the example depicted in FIG. 8, the bonded sidewalls 810, 812, 816, 818 extend in a direction that is perpendicular to the top surface 102 of the package substrate 122. The interior top surface 820 of the first stiffener member 856 may optionally be adhered to the exterior top surface 814 of the second stiffener member 858.

It is also contemplated that the composite stiffener 854 may be rotated 180 degrees such that an exterior top surface 824 of the first stiffener member 856 is secured to the top surface 102 of the package substrate 122 by the adhesive layer 602. In such an implementation where the second stiffener member 858 is not directly coupled to the top surface 102 of the package substrate 122, the composite stiffener 854 will impart less stiffness to the chip package assembly 110. However depending on the application, the more flexible configuration for the composite stiffener 854 may be still stiffness enough to meet the design flatness targets for certain configurations for the chip package assembly 110. Similarly the composite stiffener 854 may be rotated 90 or 270 degrees from the orientation shown in FIG. 8.

Figure 9:
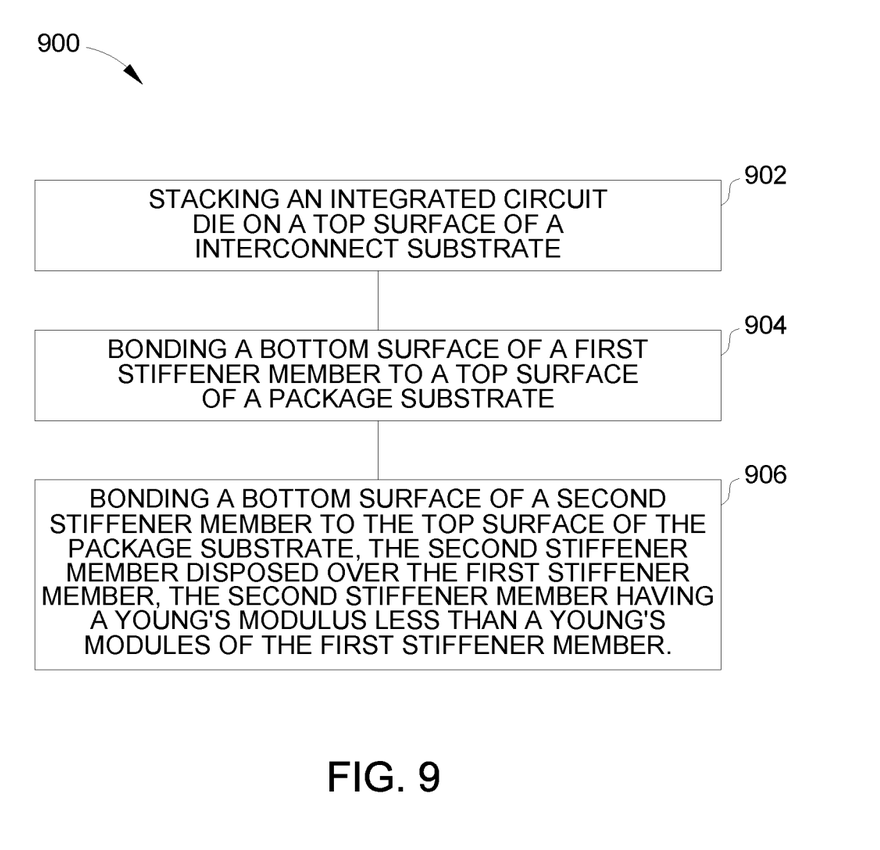
FIG. 9 is a block diagram of one example of a method for forming a chip package assembly having a composite stiffener.

FIG. 9 is a block diagram of one example of a method 900 for forming a chip package assembly, such as the chip package assemblies described above, among others. The method 900 begins at operation 902 by stacking an integrated circuit die on a top surface of an interconnect substrate. As discussed above, the interconnect substrate may be one of an interposer, an I/O die, a package substrate and the like. Stacking the integrated circuit die on the interconnect substrate includes making electrical connections between the circuitry of the die and substrate, for example, through solder or hybrid connections. As the stress and flatness is effectively managed by selection of an appropriate composite stiffener as discussed above, lead-free solder may be utilized even in large chip package assembly while maintaining robust performance and reliability.

At operation 904, a bottom surface of a first stiffener member is bonded to the top surface of the package substrate. At operation 906, a bottom surface of a second stiffener member to the top surface of the package substrate. Optionally, the first stiffener member may be bonded to the second stiffener member to form the composite stiffener prior to bonding the stiffener members to the top surface of the package substrate. In one example, operations 904, 906 utilize an adhesive layer to secure the members to the top surface of the package substrate. In one example, the second stiffener member has a Young's modulus less than a Young's modulus of the first stiffener member.

Thus, as described above, a chip package assembly and method for fabricating the same are provided which utilize a composite stiffener. The composite stiffener is configurable to provide an overall stiffness and and stress inducing properties that is tailored (i.e., selected) to provide an appropriate resistance to warpage without imparting excessive stress that may diminish the reliability of electrical connections. Advantageously, the composite stiffener may be tailored to manage stress in a manner that facilitates the reliable use of lead-free solder. Moreover, the enhanced stiffness of provided by the composite stiffener improves the reliability and performance of the chip package assembly.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
    a package substrate;
    an integrated circuit die stacked on a top surface of the package substrate; and
    an composite stiffener coupled to a first edge of the package substrate, the composite stiffener comprising:
        a first stiffener member bonded to the package substrate, the first stiffener member having a top surface; and
        a second stiffener member disposed over the first stiffener member, the second stiffener member having a bottom surface bonded to the top surface of the package substrate, the second stiffener member having an interior bottom surface disposed above the top surface of the first stiffener member, the second stiffener member having a first exterior sidewall surface disposed proximate to the integrated circuit die and a second exterior sidewall surface, the first exterior sidewall surface being disposed between the integrated circuit die and the second exterior sidewall surface, the first exterior sidewall surface and the second exterior sidewall surface each extending away from the package substrate and each meeting a top surface of the second stiffener member, the interior bottom surface being disposed between the first exterior sidewall surface and the second exterior sidewall surface, the second stiffener member having a Young's modulus less than a Young's modulus of the first stiffener member.

2. The chip package assembly of claim 1, wherein the first stiffener member is stainless steel and the second stiffener member is copper.

3. The chip package assembly of claim 1, wherein the second stiffener member and the top surface of the package substrate surround the first stiffener member.

4. A chip package assembly comprising:
    a package substrate;
    an integrated circuit die stacked on a top surface of the package substrate; and
    a composite stiffener coupled to a first edge of the package substrate, the composite stiffener comprising:
        a first stiffener member having a bottom surface bonded to the top surface of the package substrate and having a top surface; and
        a second stiffener member having a first wall connected to a second wall, the first wall and the second wall straddling the first stiffener member, the second stiffener member bonded to the top surface of the package substrate, the second stiffener member having an interior bottom surface disposed above the top surface of the first stiffener member, the second stiffener member having a first exterior sidewall surface disposed proximate to the integrated circuit die and a second exterior sidewall surface, the first exterior sidewall surface being disposed between the integrated circuit die and the second exterior sidewall surface, the first exterior sidewall surface and the second exterior sidewall surface each extending away from the package substrate and each meeting a top surface of the second stiffener member, the interior bottom surface being disposed between the first exterior sidewall surface and the second exterior sidewall surface, the second stiffener member having a Young's modulus less than a Young's modulus of the first stiffener member.

5. The chip package assembly of claim 4, wherein the first stiffener member is bonded to a recess formed in the second stiffener member, the interior bottom surface defining, at least in part, the recess.

6. The chip package assembly of claim 4, wherein the first stiffener member is stainless steel and the second stiffener member is copper.

7. The chip package assembly of claim 4, wherein the first stiffener member has a rectangular sectional profile.

8. The chip package assembly of claim 4, wherein the first stiffener member has a tubular sectional profile.

9. The chip package assembly of claim 4, wherein the first stiffener member has a sectional profile that interlocks with the second stiffener member.

10. A method for fabricating a chip package assembly, the method comprising:
   stacking an integrated circuit die on a top surface of a package substrate;
   bonding a bottom surface of a first stiffener member to the top surface of the package substrate, the first stiffener member having a first top surface; and
   bonding a bottom surface of a second stiffener member to the top surface of the package substrate, the second stiffener member disposed over the first stiffener member, the second stiffener member having an interior bottom surface disposed above the top surface of the first stiffener member, the second stiffener member having a first exterior sidewall surface disposed proximate to the integrated circuit die and a second exterior sidewall surface, the first exterior sidewall surface being disposed between the integrated circuit die and the second exterior sidewall surface, the first exterior sidewall surface and the second exterior sidewall surface each extending away from the package substrate and each meeting a top surface of the second stiffener member, the interior bottom surface being disposed between the first exterior sidewall surface and the second exterior sidewall surface, the second stiffener member having a Young's modulus less than a Young's modulus of the first stiffener member.

11. The method of claim 10 further comprising:
bonding the second stiffener member to the first stiffener member.

12. The method of claim 10 further comprising:
disposing the second stiffener member on the top surface of the package substrate, the second stiffener member and the top surface of the package substrate surrounding the first stiffener member.

13. The chip package assembly of claim 1, wherein:
the first stiffener member comprises a third exterior sidewall surface disposed proximate to the integrated circuit die and a fourth exterior sidewall surface, the third exterior sidewall surface being disposed between the integrated circuit die and the fourth exterior sidewall surface; the third exterior sidewall surface and the fourth exterior sidewall surface each extending away from the package substrate and each meeting the top surface of the first stiffener member; and
the second stiffener member comprises a first interior sidewall surface and a second interior sidewall surface, the first interior sidewall surface and the second interior sidewall surface each meeting the interior bottom surface, the first interior sidewall surface being bonded to the third exterior sidewall surface by an adhesive, the second interior sidewall surface being bonded to the fourth exterior sidewall surface by an adhesive.

14. The chip package assembly of claim 4, wherein:
the first stiffener member comprises a third exterior sidewall surface disposed proximate to the integrated circuit die and a fourth exterior sidewall surface, the third exterior sidewall surface being disposed between the integrated circuit die and the fourth exterior sidewall surface; the third exterior sidewall surface and the fourth exterior sidewall surface each extending away from the package substrate and each meeting the top surface of the first stiffener member; and
the second stiffener member comprises a first interior sidewall surface and a second interior sidewall surface, the first interior sidewall surface and the second interior sidewall surface each meeting the interior bottom surface, the first interior sidewall surface being bonded to the third exterior sidewall surface by an adhesive, the second interior sidewall surface being bonded to the fourth exterior sidewall surface by an adhesive.

15. The chip package assembly of claim 1, wherein the composite stiffener forms a ring continuously laterally surrounding the integrated circuit die.

16. The chip package assembly of claim 1, wherein the composite stiffener comprises discrete linear segments, each discrete linear segment being disposed and extending along a respective edge of the package substrate and being separated from each of the others of the discrete linear segments.

17. The chip package assembly of claim 1, wherein the composite stiffener comprises discrete corner segments, each discrete corner segment being disposed at a corner of the package substrate, each discrete corner segment including a first portion extending along a respective first edge of the package substrate extending from the respective corner and a second portion extending along a respective second edge of the package substrate extending from the respective corner, the first portion meeting the second portion at a right angle, each discrete corner segment being separated from each of the others of the discrete corner segments.

18. The chip package assembly of claim 1, wherein:
the first stiffener member comprises a third exterior sidewall surface disposed proximate to the integrated circuit die and a fourth exterior sidewall surface, the third exterior sidewall surface being disposed between the integrated circuit die and the fourth exterior sidewall surface, the third exterior sidewall surface and the fourth exterior sidewall surface each extending perpendicularly away from the top surface of the package substrate and each meeting the top surface of the first stiffener member; and
the second stiffener member comprises a first interior sidewall surface and a second interior sidewall surface, the first interior sidewall surface and the second interior sidewall surface each extending perpendicularly away from the top surface of the package substrate and each meeting the interior bottom surface, the first interior sidewall surface being by the third exterior sidewall surface in the composite stiffener, the second interior sidewall surface being by the fourth exterior sidewall surface in the composite stiffener.

19. The chip package assembly of claim 1, wherein the first stiffener member has a recess extending from the top surface of the first stiffener member to a depth in the first stiffener member.

20. The chip package assembly of claim 1, wherein:

the first stiffener member comprises a third exterior sidewall surface disposed proximate to the integrated circuit die and a fourth exterior sidewall surface, the third exterior sidewall surface being disposed between the integrated circuit die and the fourth exterior sidewall surface, the third exterior sidewall surface and the fourth exterior sidewall surface each extending away from the top surface of the package substrate and each meeting the top surface of the first stiffener member, a first width from the third exterior sidewall surface to the fourth exterior sidewall surface being proximate the top surface of the package substrate, a second width from the third exterior sidewall surface to the fourth exterior sidewall surface being at the top surface of the first stiffener member, the second width being greater than the first width; and the second stiffener member comprises a first interior sidewall surface and a second interior sidewall surface, the first interior sidewall surface and the second interior sidewall surface each extending away from the top surface of the package substrate and each meeting the interior bottom surface, the first interior sidewall surface being by the third exterior sidewall surface in the composite stiffener, the second interior sidewall surface being by the fourth exterior sidewall surface in the composite stiffener, a first distance from the first interior sidewall surface to the second interior sidewall surface being proximate the top surface of the package substrate, a second distance from the first interior sidewall surface to the second interior sidewall surface being at the interior bottom surface of the second stiffener member, the second distance being greater than the first distance.

* * * * *